(12) United States Patent
Yamate et al.

(10) Patent No.: US 6,678,028 B2
(45) Date of Patent: Jan. 13, 2004

(54) LIQUID CRYSTAL DISPLAY

(75) Inventors: Hiroshi Yamate, Mobara (JP); Yuuichi Takenaka, Mobara (JP)

(73) Assignees: Hitachi, Ltd., Tokyo (JP); Hitachi Device Engineering Co., Ltd., Mobara (JP)

( * ) Notice: Subject to any disclaimer, the term of this patent is extended or adjusted under 35 U.S.C. 154(b) by 0 days.

(21) Appl. No.: 10/022,259

(22) Filed: Dec. 20, 2001

(65) Prior Publication Data

US 2002/0080318 A1 Jun. 27, 2002

(30) Foreign Application Priority Data

Dec. 25, 2000 (JP) ........................................ 2000-392324

(51) Int. Cl.[7] ............................................ G02F 1/1345
(52) U.S. Cl. ........................ 349/151; 349/149; 349/152; 257/737
(58) Field of Search ................................. 349/149, 150, 349/151, 152; 257/737, 778, 738

(56) References Cited

U.S. PATENT DOCUMENTS 6,297,868 B1 * 10/2001 Takenaka et al. ........... 349/151

2002/0100974 A1 * 8/2002 Uchiyama ................... 257/737

FOREIGN PATENT DOCUMENTS

JP          05093917 A   *   4/1993   ......... G02F/1/1345

* cited by examiner

*Primary Examiner*—Jerome Jackson
*Assistant Examiner*—Matthew C. Landau
(74) *Attorney, Agent, or Firm*—Antonelli, Terry, Stout & Kraus, LLP

(57) ABSTRACT

A liquid crystal display is provided with respective signal lines and a semiconductor chip. Respective output bumps of the semiconductor chip are connected to corresponding respective signal lines through ax anisotropic conductive layer. The respective output bumps include a first group of output bumps which are arranged at a side close to the signal lines and a second group of output bumps which are arranged at a side remote from the signal lines. The area of respective bumps of the second group of output bumps which face the signal lines in an opposed manner is set larger than the area of respective bumps of the first group of output bumps which face the signal lines in an opposed manner. Due to such a constitution, a reliable connection between the mounted semiconductor integrated circuit and the signal lines is ensured.

8 Claims, 9 Drawing Sheets

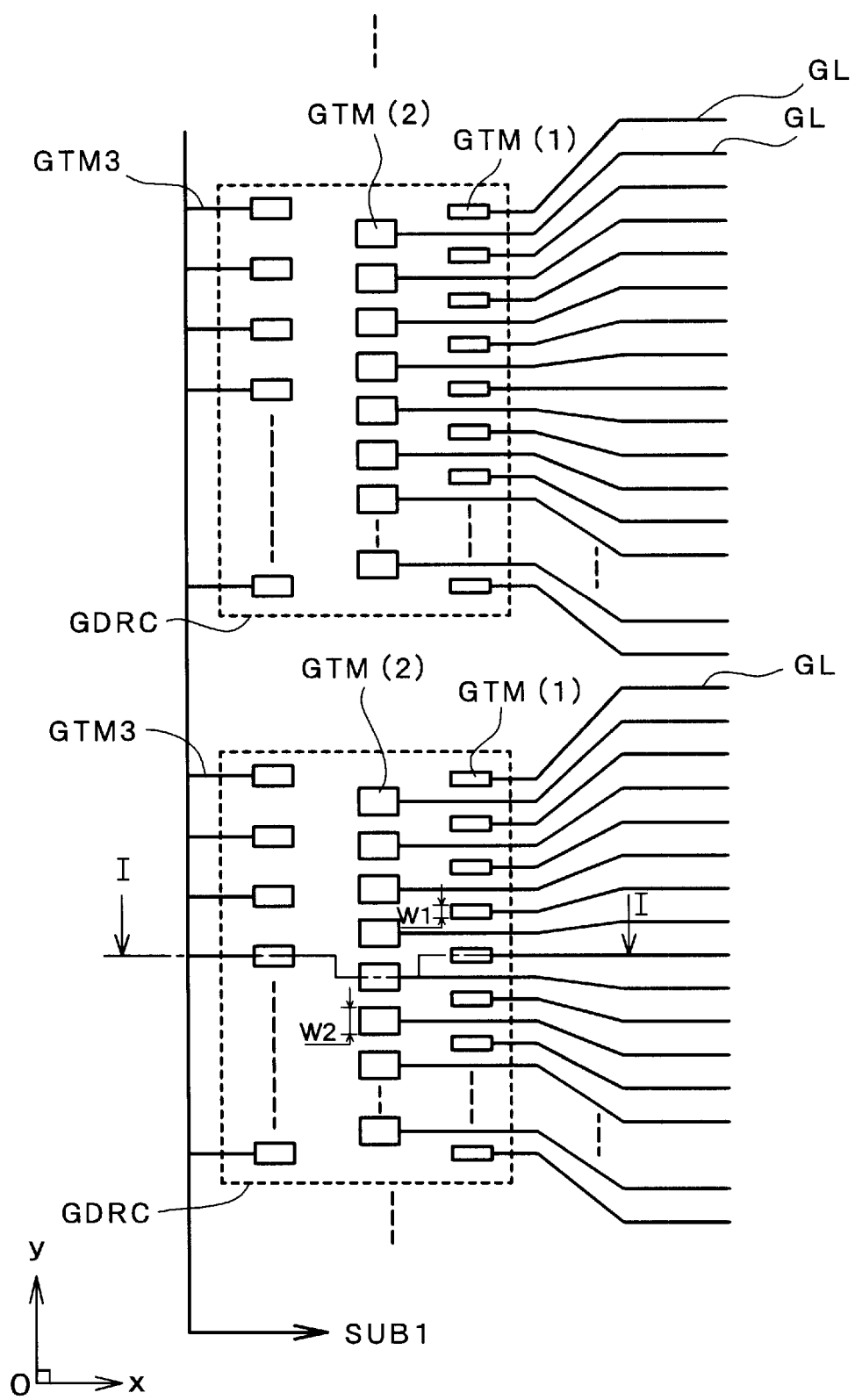

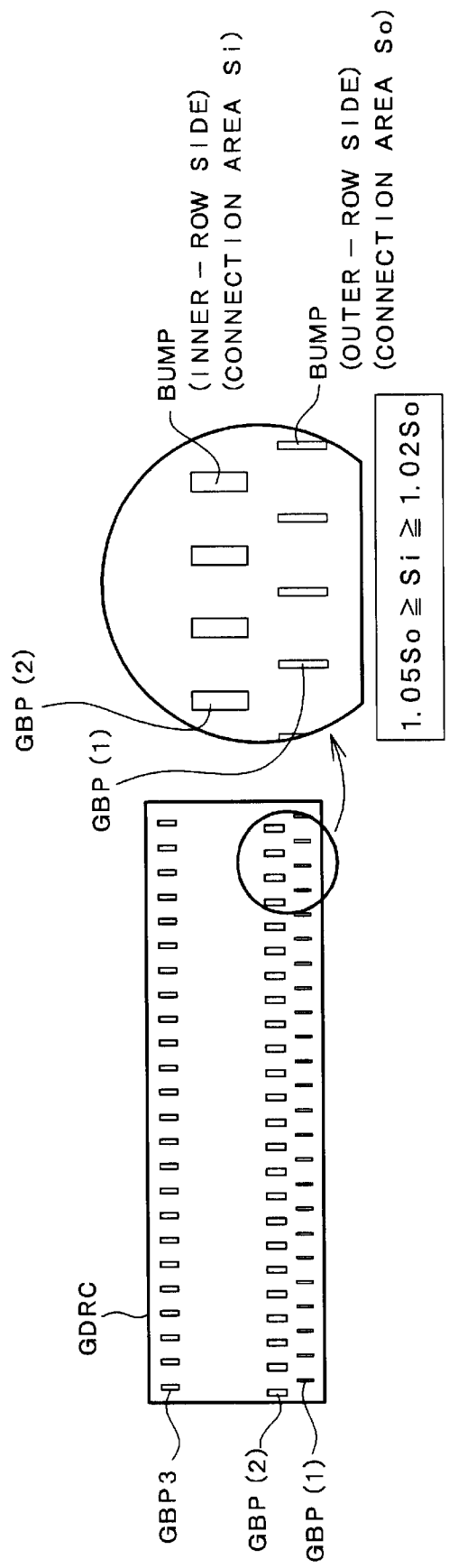

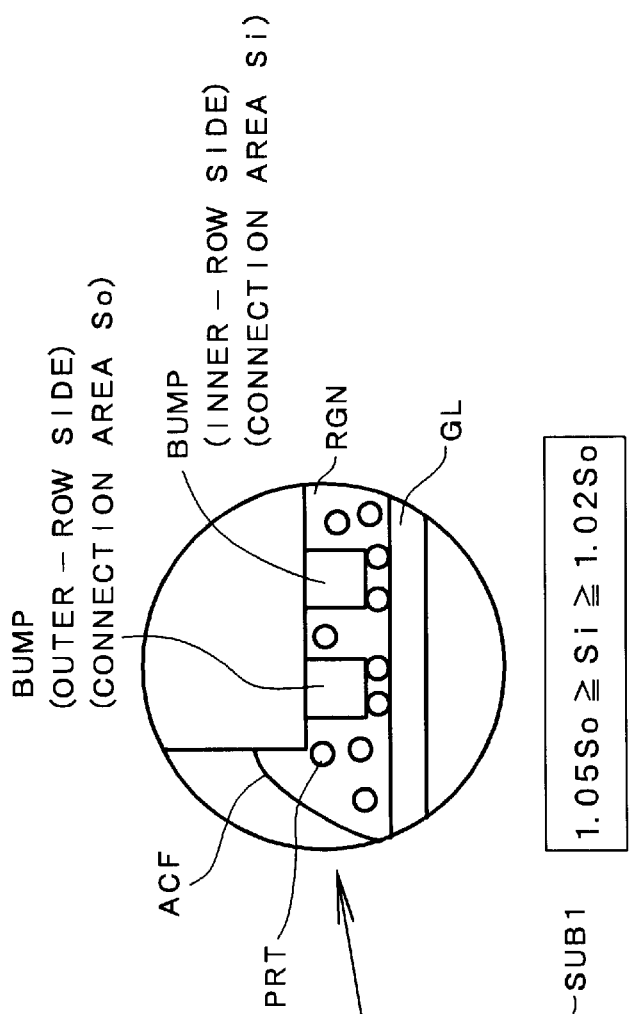
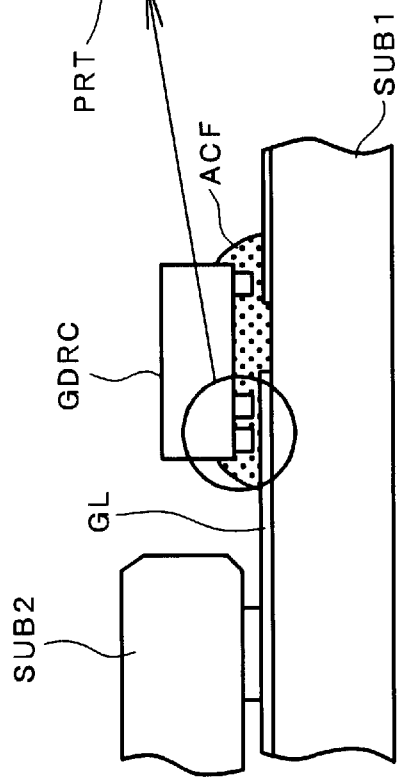

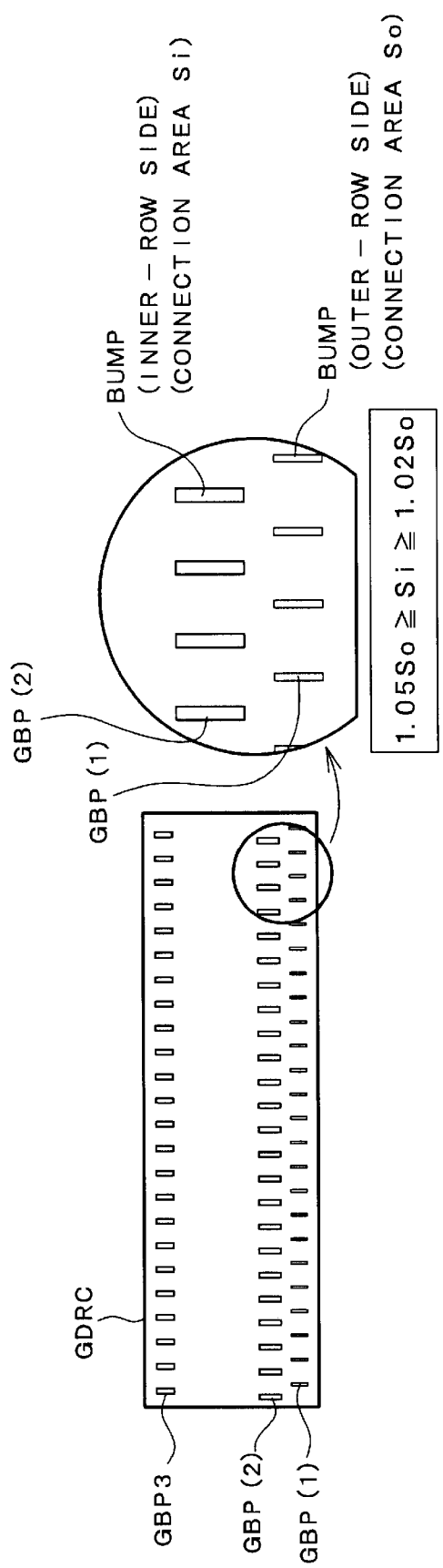

FIG. 8

Number of ACF particles captured under bumps arranged in two rows and result of area allocation obtained by optimization

| Specifications of ACF (Expressed by combination of specifications) | Number of captured ACF particles under bumps | | | Change of area by optimization | | | area difference between inner and outer rows |
|---|---|---|---|---|---|---|---|
| | inner-row side mi | outer-row side mo | ratio mo/mi | inner-row side Si/S | outer-row side So/S | area ratio Si/So | Si/So−1 |
| resin ① – reference diameter – low | 7.72 | 8.08 | 104.7% | 1.020 | 0.980 | 1.041 | 4.1% |
| resin ② – reference diameter – reference | 8.34 | 8.65 | 103.7% | 1.016 | 0.984 | 1.033 | 3.3% |
| resin ② – reference diameter – reference | 9.91 | 10.25 | 103.4% | 1.015 | 0.985 | 1.031 | 3.1% |
| resin ④ – reference diameter – reference | 11.37 | 11.95 | 105.1% | 1.023 | 0.977 | 1.047 | 4.7% |
| resin ④ – reference diameter – reference | 11.13 | 11.68 | 104.9% | 1.022 | 0.978 | 1.045 | 4.5% |
| resin ② – reference diameter – high | 13.39 | 13.69 | 102.2% | 1.010 | 0.990 | 1.021 | 2.1% |
| resin ③ – reference diameter – high | 13.56 | 13.86 | 102.2% | 1.010 | 0.990 | 1.020 | 2.0% |

FIG. 9A (PRIOR ART)
FIG. 9B (PRIOR ART)
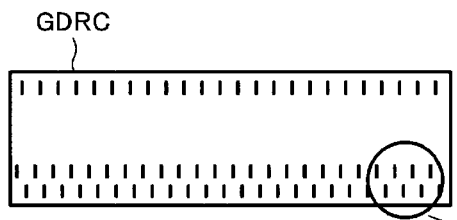
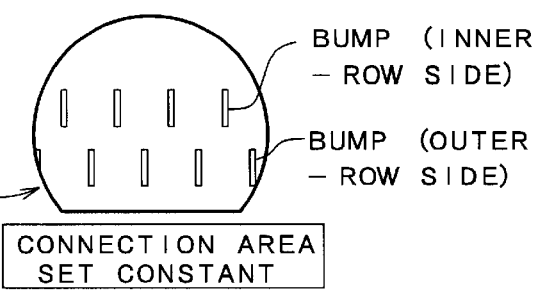
FIG. 10
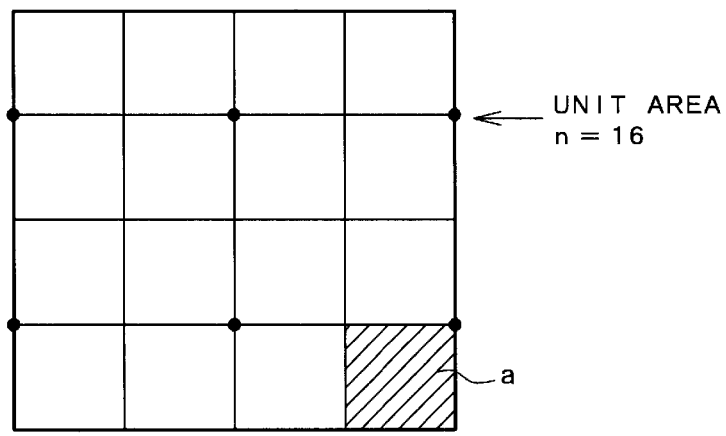
FIG. 11
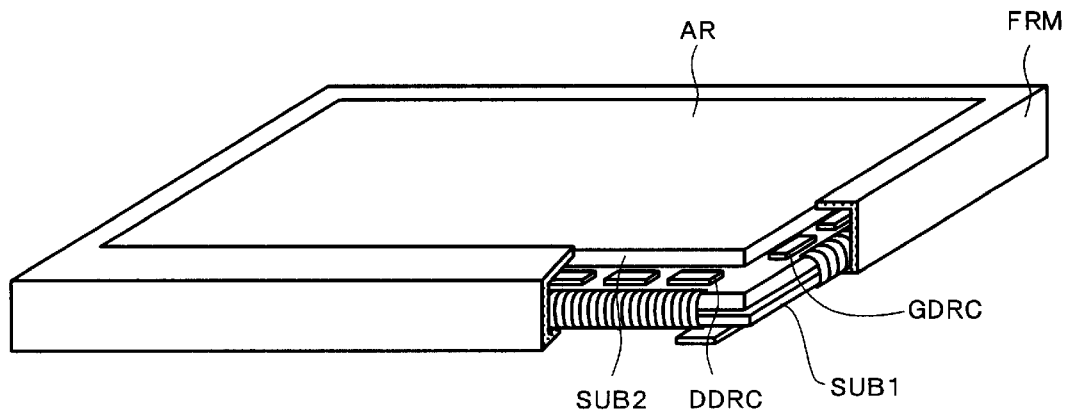

LIQUID CRYSTAL DISPLAY

BACKGROUND OF THE INVENTION

The present invention relates to a liquid crystal display, and more particularly, to a liquid crystal display of a so-called active-matrix type.

The liquid crystal display of the active-matrix type is provided with a plurality of gate signal lines, which extend Act in the X direction and are arranged in parallel in the Y direction, and a plurality of drain signal lines, which extend in the Y direction and are arranged in parallel in the X direction, on a liquid-crystal-side surface of one of two substrates which are arranged to face each other in an opposed manner while inserting liquid crystal disposed therebetween. A region which is surrounded by two neighboring gate signal lines and two neighboring drain signal lines defines a pixel region.

Each pixel region is provided with a switching element which is driven by scanning signals from one-side via a gate signal line and a pixel electrode to which video signals are supplied from one-side via a drain signal line through the switching element.

On a liquid-crystal-side surface of the other substrate, of the pair of substrates, pixel electrodes are formed which face the pixel electrodes on the one substrate in an opposed manner and constitute capacitors. By generating an electric field between the pixel electrodes which are respectively formed on the two substrates, the light transmittivity of the liquid crystal is controlled.

Further, on a periphery of the liquid-crystal-side surface of one substrate, a semiconductor integrated circuit (IC chip), which constitutes a scanning signal driving circuit, and a semiconductor integrated circuit (IC chip) which constitutes a video signal driving circuit, are directly mounted with bump forming surfaces thereof directed downwardly (face down) (COG: Chip On Glass). On the substrate on which the IC chips are mounted, signal lines which correspond to the IC chips are extended to positions which face respective output bumps of the IC chips and terminals which are connected with the output bumps are formed on the extended portions or extensions.

Recently, there has been a demand for the liquid crystal displays to exhibit an enhancement of the definition thereof. To satisfy this requirement, the number of pixels has been increased and the number of gate signal lines and drain signal lines has been increased correspondingly.

As bumps (particularly, output bumps) which are connected to the signal lines of the semiconductor integrated circuit, there is a known arrangement of bumps which provides for an increased number of bumps, wherein the bumps are constituted of a first group of bumps which are arranged at the signal-line side and a second group of bumps which are arranged at the side remote from the signal lines.

In a liquid crystal display of the COG type, the semiconductor integrated circuits are fixedly secured to the substrate by way of anisotropic conductive layers and are, respectively connected to corresponding terminals. Japanese Laid-open Patent Publication 81635/2000 discloses such a technique.

However, in this case, the connection resistance between the respective bumps which constitute the second group of bumps and the respective terminals connected to these respective bumps becomes larger than the connection resistance between the respective bumps which constitute the first group of bumps and the respective terminals connected to these bumps. Accordingly, in a worst case, there arises a possibility that the second group of bumps may suffer from a connection failure.

SUMMARY OF THE INVENTION

The present invention, which has been made in view of the above-mentioned circumstances, is able to provide a liquid crystal display which can ensure the connection between semiconductor integrated circuits and signal lines mounted on the liquid crystal display.

A liquid crystal display according to the present invention is provided with a plurality of signal lines which respectively have connection terminals and a semiconductor chip which is connected to respective terminals of a plurality of signal lines on a liquid-crystal-side surface of one of two substrates which are arranged to face each other with liquid crystal being disposed therebetween. The semiconductor chip includes a plurality of bumps which are respectively connected to corresponding terminals of respective signal lines through the anisotropic conductive layer. Further, a plurality of these bumps constitute at least groups of bumps arranged in two rows. The bumps include a first group of bumps, which are arranged at a side close to an end portion of the semiconductor chip, and a second group of bumps, which are arranged at a side remote from the end portion, wherein a contact area between the respective bumps of the second group of bumps and the signal lines is set to be larger than a contact area between the respective bumps of the first group of bumps and the signal lines.

The liquid crystal display according to the present invention has a resistance value at the contact portion between the respective bumps of the second group of bumps and the signal lines which is reduced to a level substantially equal to the resistance value at the contact portion between the respective bumps of the first group of bumps and the signal lines.

Accordingly, it becomes possible to eliminate the phenomenon in which the connection resistance between the respective bumps which constitute the second group of bumps and the signal lines which are connected to these bumps is increased, or a connection failure occurs in the worst case.

BRIEF DESCRIPTION OF THE DRAWINGS

FIG. 2 is a plan view of a surface of a transparent substrate on which IC chips are mounted.

FIG. 3A is a front view of a surface on which bumps of a semiconductor integrated circuit mounted on the liquid crystal display according to the present invention are formed.

FIG. 3B is a partial enlarged view of area A in FIG. 3A.

FIG. 4A is a cross-sectional view taken along a line I—I of FIG. 2.

FIG. 4B is a partial enlarged view of area A in FIG. 4A.

FIG. 5A is a front view of another embodiment of the semiconductor integrated circuit mounted on the liquid crystal display according to the present invention showing a plan view of a surface on which bumps are formed.

FIG. 5B is a partial enlarged view of area A in FIG. 5A.

FIG. 8 is a comparison chart of a bonding area between bumps and connection terminals and the number of conductive particles.

FIG. 9A is a front view of a surface on which bumps of a semiconductor integrated circuit mounted on a conventional liquid crystal display are formed.

FIG. 9B is a partial enlarged view of area A in FIG. 9A.

FIG. 10 is a reference diagram for obtaining an approximation formula of the distribution of the number of particles on bumps.

FIG. 11 is a perspective view, partly in cross section, which shows one embodiment of the liquid crystal display according to the present invention.

DESCRIPTION OF THE PREFERRED EMBODIMENTS

Preferred embodiments of a liquid crystal display according to the present invention will be explained in conjunction with attached drawings.

Embodiment 1
<<Equivalent circuit>>

Figure 1:
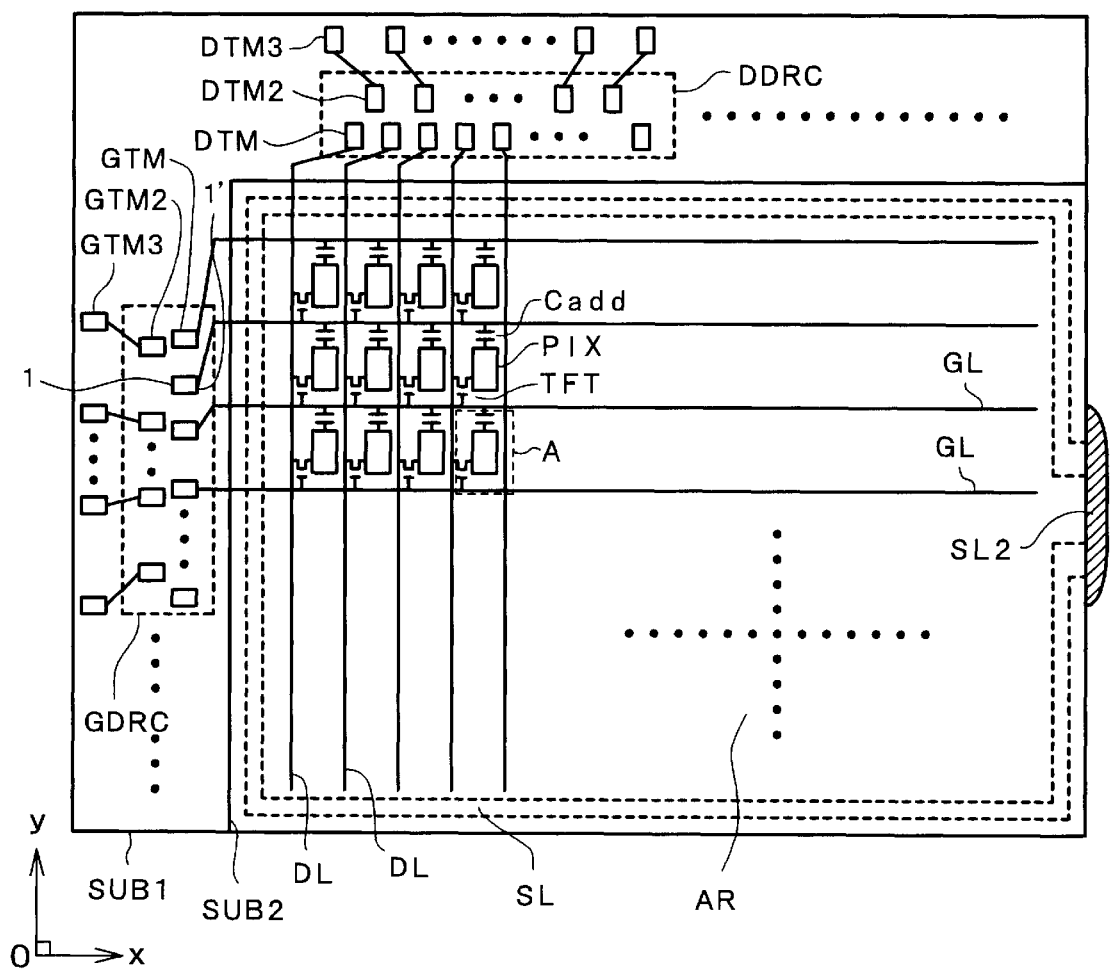
FIG. 1 is an overall equivalent circuit diagram of a liquid crystal display according to the present invention.

FIG. 1 is an equivalent circuit diagram showing one embodiment of a liquid crystal display according to the present invention. The drawing is a circuit diagram in which are disposed corresponding to an actual geometric arrangement.

One transparent substrate SUB1 is arranged to face the other transparent substrate SUB2 in an opposed manner liquid crystal being disposed therebetween.

On a liquid-crystal-side surface of the transparent substrate SUB1, a plurality of gate signal lines GL, which extend in the X direction and are arranged in parallel in the Y direction, and a plurality of drain signal lines DL, which are insulated from the gate signal lines GL and extend in the Y direction and are arranged in parallel in the X direction, are formed. A rectangular region which is surrounded by two neighboring gate signal lines and two neighboring drain signal lines constitutes a pixel region. A display region AR is constituted of a mass of these pixel regions.

On each pixel region, a thin film transistor TFT, which is driven by scanning signals (voltage) supplied from one-side gate signal line GL, and a pixel electrode PIX, to which video signals (voltage) are supplied from one-side drain signal line DL through the thin film transistor TFT, are formed.

Further, a capacitive element Cadd is formed between the pixel electrode PIX and the other-side gate signal line GL, which is disposed close to the above-mentioned one-side gate signal line GL. This capacitive element Cadd can store the video signals supplied to the pixel electrode PIX for a long time when the thin film transistor TFT is turned off.

The other transparent substrate SUB2 is provided with a counter electrode CT (not shown in the drawing) on a liquid-crystal-side surface thereof, wherein the counter electrode CT is provided in common for the respective pixel regions. An electric field is generated between the pixel electrodes PIX and the counter electrode CT, which is arranged to face the pixel electrodes PIX in an opposed manner with the liquid crystal interposed therebetween. The light transmittivity of the liquid crystal between respective electrodes is controlled in response to this electric field.

One end of respective gate signal lines GL extend toward one side (left side in the drawing) of the transparent substrate SUB1, and terminal portions GTM are formed at extensions of the respective gate signal lines GL. Bumps of an IC chip GDRC, which is constituted of a vertical scanning circuit, are connected to the terminal portions GTM.

Further, one end of respective drain signal lines DL extends toward one side (upper side in the drawing) of the transparent substrate SUB1, and terminal portions DTM are formed at extensions of the respective drain signal lines DL. Bumps of a semiconductor integrated circuit DDRC, which is constituted of a video signal driving circuit, are connected to the terminal portions DTM.

IC chips GDRC and DDRC, per se, are respectively directly mounted on the transparent substrate SUB1, thus constituting a so-called COG (Chip-On-Glass) system.

Respective bumps provided at the input sides of the IC chips GDRC, DDRC are also respectively connected to terminal portions GTM2, DTM2, which are formed on the transparent substrate SUB1. These respective terminal portions GTM2, DTM2 are connected to terminal portions GTM3, DTM3, which are respectively arranged at a peripheral portion of the transparent substrate SUB1 closest to an end surface of the transparent substrate SUB1 out of peripheral portions of the transparent substrate SUB1.

The transparent substrate SUB2 is arranged to face the transparent substrate SUB1, such that the transparent substrate SUB2 does not cover the area on which the semiconductor integrated circuit is mounted. That is, the area of the transparent substrate SUB2 is made smaller than the area of the transparent substrate SUB1.

The transparent substrate SUB2 is fixedly secured to the transparent substrate SUB1 using a sealing agent SL, which is formed around the periphery of the transparent substrate SUB2. The sealing agent SL also has a function of sealing the liquid crystal between the transparent substrates SUB1 and SUB2.

As shown in FIG. 11, the liquid crystal display having such a constitution is covered with a frame FRM having an opening to accommodate a display portion AR, thus constituting a liquid crystal display module.

<<Constitution in the vicinity of the semiconductor integrated circuit>>

FIG. 2 is a plan view which shows a specific example of the constitution on the surface of the transparent substrate SUB1 in the vicinity of the IC chip GDRC, which is mounted on the transparent substrate SUB1.

In FIG. 2, with respect to respective gate signal lines GL that are arranged in the Y direction, the neighboring gate signal lines GL are formed into a group. The distance between the bumps of the IC chip GDRC is set to be smaller than the distance between respective gate signal lines GL in the display portion AR; and, hence, respective gate signal lines GL of each group converge with each other in the vicinity of the region on which the IC chip GDRC is mounted. The terminals GTM are formed at positions which face the respective output bumps of the IC chip GDRC.

The terminals GTM, which are connected to respective output bumps of the IC chip GDRC, are constituted of a first group of terminals and a second group of terminals, which are arranged in rows.

Respective terminals GTM(1) which constitute the first group of terminals, are positioned at an image-display-region side (also referred to as "outer row side" as will be explained later), while respective terminals GTM(2), which constitute the second group of terminals, are positioned at a side remote from the image-display-region side (also referred to as "inner row side" as will be explained later).

When the IC chip GDRC is mounted on the substrate, the first group of terminals is positioned in the vicinity of the end portion of the IC chip and the second group of terminals is positioned closer to the center of the IC chip than the first group of terminals.

Further, each terminal GTM(2) is positioned between respective terminals GTM(1), and respective terminals GTM, which are constituted by respective terminals GTM(2) and respective terminals GTM(1), are arranged in a so-called staggered pattern.

Accordingly, each gate signal line GL which is connected to the terminal GTM(2) is formed such that the gale signal line GL is positioned between the gate signal lines GL which are connected to the terminals GTM(1) and runs between the neighboring terminals GTM(1).

Further, respective terminals GTM(2), which constitute the second group of terminals, have a width W2 which is larger than the width Wi of the respective terminals GTM(1), which constitute the first group of terminals.

With respect to the terminals GTM(2), the gate signal line GL is not formed between these terminals GTM(2); and, hence, the terminals GTM(2) can have a larger width W2 than the width Wi of the terminals GTM(1).

The reason why the width W2 of the terminals GTM(2) is set to be large is to make the area of each terminal GTM(2), which faces the corresponding output bump of the IC chip GDRC, larger than the area of each terminal GTM(1) which faces the corresponding output bump of the IC chip GDRC. For example, in this embodiment, the area of each terminal GTM(1) which faces the corresponding output bump of the IC chip GDRC is 2400 $\mu m^2$. On the other hand, the area of each terminal GTM(2) which faces the corresponding output bump of the IC chip GDRC is set to be larger than the area of each terminal GTM(1) which faces the corresponding output bump of the IC chip GDRC by 2 to 5%.

FIG. 3A is a plan view which shows a bump forming surface of the IC chip GDRC, and FIG. 3B is an enlarged view of a portion A circled by a solid line in FIG. 3A.

Output bumps GBP of the IC chip GDRC are constituted of a first group of bumps and a second group of bumps, which are arranged in rows. The respective bumps GBP(1), which constitute a first group of bumps, are positioned corresponding to the terminals GTM(1) of the gate signal lines GL, while the respective bumps GBP(2), which constitute a second group of bumps, are positioned corresponding to the terminals GTM(2) of the gate signal lines GL.

The first group of bumps is arranged in the vicinity of the long-side of the rectangular IC chip GDRC, and the second group of bumps is arranged closer to the center of the IC chip GDRC than the first group of bumps. In the same manner as the arrangement of the terminals GTM, each bump GBP(2) is positioned between respective bumps GBP(1), and respective bumps GBP, which are constituted of respective bumps GBP(2) and respective bumps GBP(1), are arranged in a so-called staggered pattern.

A width of the bumps GBP(2) which constitute the second group of bumps, is set to be larger than the width of the bumps GBP(1), which constitute the first group of bumps. The reason why the width of the bumps GBP(2) is set to be larger than the width of the bumps GBP(1) is to make the area of each second bump GBP(2) which faces the terminal GTM(2) larger than the area of each first bump GBP(1) which faces the terminal GTM(1).

In this embodiment, if it is assumed that the area of the bump GBP(1) of the IC chip GDRC which faces the corresponding terminal GTM(1) is designated So and the area of the bump GBP(2) of the IC chip GDRC which faces the corresponding terminal GTM(2) is designated Si, the following formula (1) is established.

$$1.05So >> Si >> 1.02So \quad \ldots (1)$$

FIG. 4A is a cross-sectional view showing a case in which the IC chip GDRC is mounted on the transparent substrate SUB1, and it corresponds to a cross-sectional view taken along a line I—I in FIG. 2. Further, FIG. 4B is an enlarged view of a portion A circled by a solid line in FIG. 4A.

An anisotropic conductive film ACF is interposed between the IC chip GDRC and the transparent substrate SUB1. The anisotropic conductive film ACF is formed of a resin film RGN in which a large number of conductive particles PRT are scattered. In this embodiment, an anisotropic film ACF in which the conductive particles PRT are scattered at the rate of 30 k pieces/mm$^2$ is used.

By heating the anisotropic conductive film ACF and pressing the IC chip GDRC to the transparent substrate SUB1, the IC chip GDRC is fixedly secured to the transparent substrate SUB1 and respective bumps GBP on the IC chip GDRC and the terminals GTM on the transparent substrate SUB1 are electrically connected with each other through the conductive particles inside of the anisotropic conductive film ACF.

When the IC chip GDRC is pressed to the transparent substrate SUB1, a flow of the conductive particles PRT is generated inside of the resin film RGN of the anisotropic conductive film ACF.

In this embodiment, the number of conductive particles PRT which are interposed between each bump GBP(2) of the group of bumps at the inner-row side of the IC chip GDRC and the terminal GTM(2), which is connected to the bump GBP(2), can be set substantially equal to the number of the conductive particles PRT which are interposed between each bump GBP(1) of the group of bumps at the outer-row side of the IC chip GDRC and the terminal GTM(1), which is connected to the bump. GBP(1). Accordingly, the connection resistance between the terminal GTM(2) and the bump GBP(2) can be made substantially equal to the connection resistance between the terminal GTM(1) and the bump GBP(1).

In the above-mentioned embodiment, the width of the bumps GBP(2) at the inner-row side, out of the output bumps GBP of the semiconductor integrated circuit GDLC, and the terminals GTM(2) which face the bumps GBP(2) is set to be larger than the width of the bumps GBP(1) at the outer-row side, out of the output bumps GBP of the semiconductor integrated circuit GDLC, and the terminals GTM(1) which face the bumps GBP(1).

Figure 6:
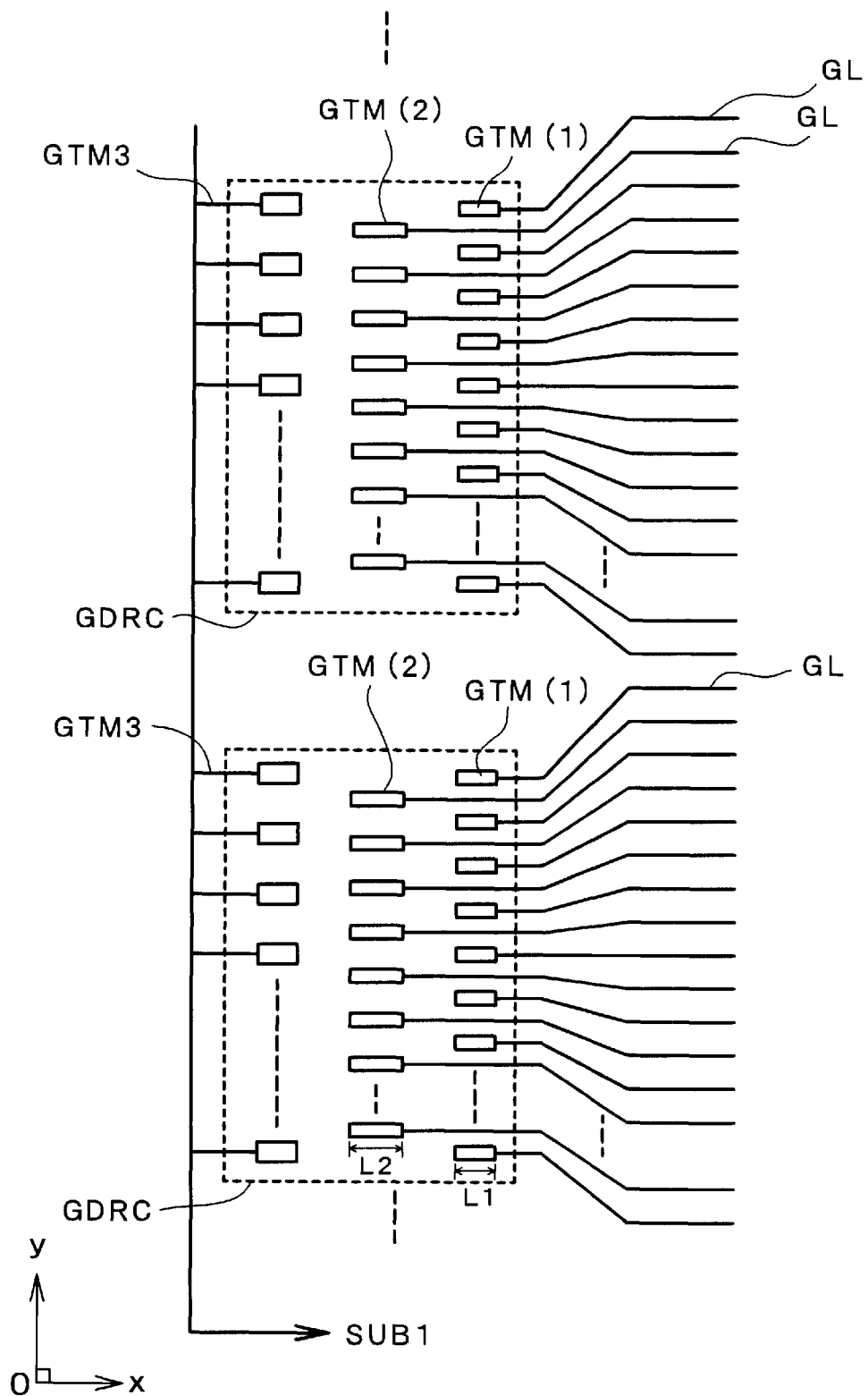
FIG. 6 is a plan view of a surface of a transparent substrate on which IC chips are mounted.

FIG. 5A is a plan view showing another embodiment of the IC chip which is mounted on the liquid crystal display according to the present invention, and it is a front view of a surface on which bumps are formed. FIG. 5B is a partial enlarged view of the area A in FIG. 5A. FIG. 6 is a plan view of the surface of the transparent substrate on which IC chips shown in FIG. 5A are mounted.

As shown in FIG. 5A, FIG. 5B and FIG. 6, the length L2 of the bumps GBP(2) at the inner-row side and the terminals GTM(2) which face the bumps GBP(2) may be set to be larger than the length Li of the bumps GBP(1) at the outer-row side and the terminals GTM(1) which face the bumps GBP(1).

Further, although the above-mentioned embodiment has been explained with respect to the output bumps GBP of the IC chip GDRC and the terminals BTM of the gate signal lines GL which are connected to the output bumps GBP, the above-mentioned constitution is also applicable to the output bumps of the IC chip DDRC and the terminals DTM of the drain signal lines DL which are connected to the output bumps.

<<Advantageous effect obtained based on theory>>

Figure 7:
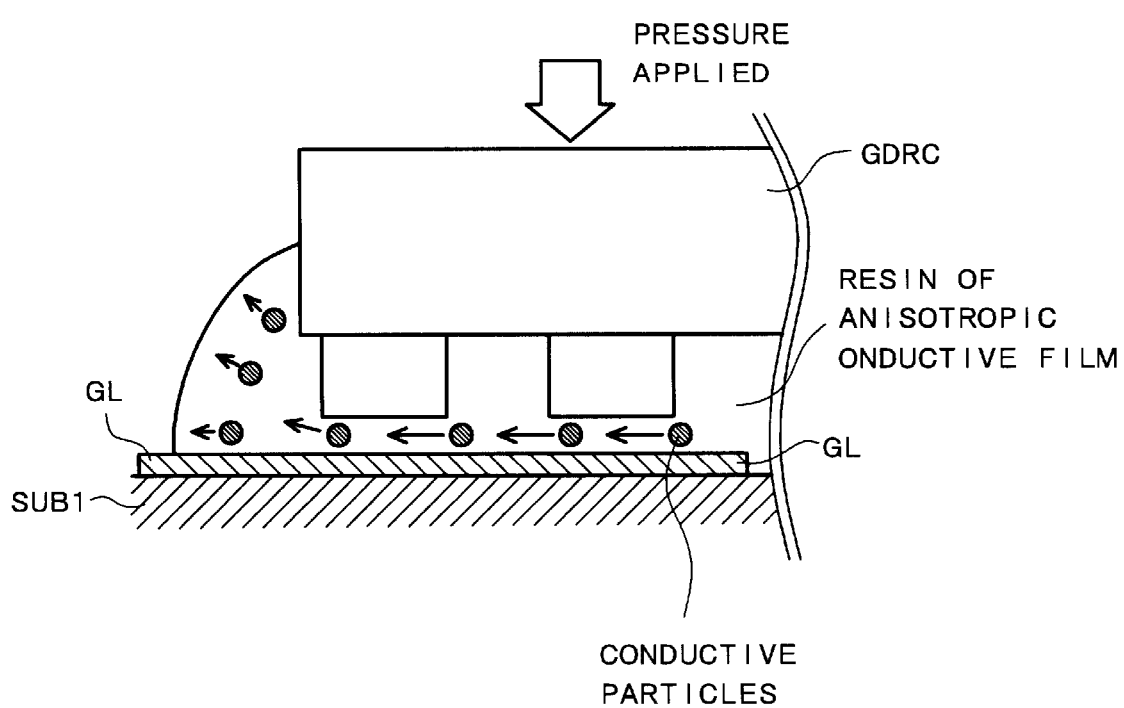
FIG. 7 is a cross-sectional view illustrating the movement of conductive particles when the IC chip is bonded to the transparent substrate under pressure.

As shown in FIG. 7, in the mounting based on the COG system, the pressure is applied from the back-surface side of the IC chip GDRC so as to push out any extra amount of resin which is present between the transparent substrate SUB1 and the IC chip GDRC, whereby the IC chip GDRC is bonded to the substrate SUB1 under pressure, and the bumps are electrically connected to the gate terminals.

In such a case, the reason why the conductive particles PRT are not captured at the inner-row side is considered to be derived from the flow of the resin at the time of bonding under pressure. That is, in the pressure-bonding process, the resin present in the vicinity of the bumps of the inner-row side is more liable to be pushed uniformly on the surface than it is on the bumps of the outer-row side, so that the particles flow parallel to the surface of the transparent substrate SUB1.

However, at the side of the bumps of the outer-row, which is close to the end surface of the chip, the flow of the particles is interrupted by the resin which is discharged to the end surface, so that the flow speed of the particle becomes slow. As a result, compared to the resin which enters below the bumps of the IC chip GDRC, the resin which departs from the position below the IC chip GDRC becomes small transitionally; and, hence, it is considered that the conductive particles which are sandwiched and remain between the bumps of the IC chip GDRC and the transparent substrate SUB1 are increased in number at the bumps of the outer-row side.

Accordingly, as explained with reference to the above-mentioned embodiment, by increasing the bonding area of the bump GBP(2) of the inner-row side and the terminal GTM(2), the number of the conductive particles captured inside of the bonding region can be made substantially equal to the number of the conductive particles captured inside of the bonding region of the bump GBP(1) of the outer-row side and the terminal GTM(1).

FIG. 9A is a front view of a surface on which bumps of a semiconductor integrated circuit mounted on a conventional liquid crystal display are formed. FIG. 9B is a partial enlarged view of the portion A in FIG. 9A.

With respect to a conventional structure in which bumps are arranged in two rows, according to the actually measured data, the number of particles is different between the inner row and the outer row, and a tendency is recognized in that, as a mean value, the number of captured particles at the outer-row side is greater than the number of captured particles at the inner-row side by 2 to 5%.

Further, the frequency distribution of the captured particles takes on a Poisson distribution theoretically.; and, hence, assuming the mean value of the captured particles remaining under the bump is designated by "m", the occurrence probability of the bumps where the particles are not captured can be calculated by exp (−m).

As a result, assuming that the total area occupied by the inner-row bumps and the outer-row bumps is constant, and the mean value of the captured particles is changed in proportion to the change of the bump area, the ratio of the area of the inner-row bumps with respect to the outer-row bumps, where the occurrence probability of the bumps which do not capture the particles becomes lowest can be calculated using the following equation (2).

$$F = \exp(-mi')/2 + \exp(-mo')/2 \quad \ldots (2)$$

wherein, $mi' = Si/S \times mi$ (equation expressing the relationship between the number of captured particles and the area of bumps), $mo' = So/S \times mo$ (equation expressing the relationship between the number of captured particles and the area of bumps), $Si + So = 2S$ (condition to make the total area of bumps constant), $dF/dSi = 0$ (condition for optimizing the total area of bumps).

Further, S: area of bumps which is not optimized (inner-row area and outer-row are being equal), mi: mean captured number of particles PRT captured by inner-row bumps (actually measured data), mo: mean captured number of particles PRT captured by outer-row bumps (actually measured data), Si: area of inner-row bumps which is optimized, So: area of outer-row bumps which is optimized, mi': mean captured number of particles PRT captured by inner-row bumps after optimizing area (estimated value), mo': mean captured number of particles PRT captured by outer-row bumps after optimizing area(estimated value), F: estimated occurrence rate of bumps with no particles (per one bump) while assuming the mean number of captured particles by inner-row bumps is mi' and the mean number of captured particles by outer-row bumps is mo'.

Then, the result obtained by carrying out the equation (2) based on respective measured data is shown in FIG. 8.

Seven kinds of specifications of the anisotropic conductive films are described in FIG. 8. These anisotropic conductive films differ from each other in the specification of the resin, the diameter of particles, and the density of particles in the film. The total area of bumps is set constant throughout these anisotropic conductive films.

When the area difference ((Si/So)−1) is less than 2%, the number of captured particles in the inner-row bump portions is smaller than the number of captured particles in the outer-row bump portions; and, hence, the connection resistance of the inner-row bump portions becomes higher than the connection resistance of the outer-row bump portions. On the other hand, when the area difference exceeds 5%, the connection resistance of the outer-row bump portions becomes higher than the connection resistance of the inner-row bump portions. Based on such measured data, the optimal value was obtained when the area difference was set to a range of 2 to 5%.

The approximate equation of the distribution of the number of particles on bumps can be calculated as follows.

Assuming the population mean density of particles per unit area after pressure bonding is designated "n" (pieces/mm$^2$) and the area of a small region when the unit area is divided in n parts is designated "a", the probability that the particles are present in the small region is "a". Since the probability P(r) that r regions which include particles are present when n small regions are sampled follows the binominal distribution, the following equation is established.

$$P(r) = nCr \cdot a^r \cdot (1-a)^{(n-r)} \quad \ldots (3)$$

This equation is also applicable to a small region "b" which has the larger area than "a".

That is, the following equation (4) is also established.

$$P(r) = nCr \cdot b^r \cdot (1-b)^{(n-r)} \quad \ldots (4)$$

In this case, the mean value becomes nb and the dispersion $\sigma^2$ becomes nb(1-b).

When "n" is large or "b" is extremely small, the equation (3) can be approximated by the Poisson distribution; and, hence, the following equation (5) can be obtained.

$$P(r) = (nb)^r \cdot e^{-(nb)}/r! \quad \ldots (5)$$

Since nb is the mean number of particles in the small region, by setting nb as nb=m, the equation (5) can be approximated by the following equation (6).

$$P(r)=m^r \cdot e^{-m}/r! \quad \ldots (6)$$

In this case, the dispersion $\sigma^2$ becomes $\sigma^2=m$ and, hence, the probability can be expressed with only one variable m.

As an example of application of the Poisson distribution, the number of bacteria within a visual field of a microscope or defective products among products produced on a mass production basis and the like are known.

In the above-mentioned embodiments, a liquid crystal display which is provided with an IC chip having groups of bumps in two rows at one side thereof has been explained. With respect to a liquid crystal display which is provided with an IC chip having groups of bumps of three or more rows at one side, the bonding area of a group of bumps which is closest to the end portion of the IC chip is minimized and the bonding area of the bumps is increased as the groups of bumps are moved away from the end portion of the IC chip.

As can be clearly understood from the above-mentioned explanation, according to the liquid crystal display of the present invention, a reliable connection between a mounted semiconductor integrated circuit and signal lines can be obtained.

What is claimed is:

1. A liquid crystal display including respective signal lines extending in one direction and arranged in parallel in a direction intersecting the one direction and a semiconductor chip mounted on one-end of the signal lines and having a bump forming surface directed toward a liquid-crystal-side surface of one of a pair of substrates arranged to face each other with an liquid crystal disposed therebetween, the improvement being characterized in that respective output bumps of the semiconductor chip are connected to the corresponding signal lines through an anisotropic conductive layer, and the respective output bumps include a first group of output bumps arranged at a position close to one end portion of the semiconductor chip and a second group of output bumps arranged at a position remote from the one end portion of the semiconductor chip, and an area of respective bumps of the second group of output bumps facing the signal lines in an opposed manner is set larger than area of respective bumps of the first group of output bumps facing the signal lines in an opposed manner.

2. A liquid crystal display according to claim 1, wherein the respective bumps of the first group of output bumps and of the second group of output bumps are staggered with respect to one another.

3. A liquid crystal display according to claim 1, wherein a width of the respective bumps of the second group of output bumps is set larger than a width of the respective bumps of the first group of output bumps.

4. A liquid crystal display according to claim 1, wherein a length of the respective bumps of the second group of output bumps is set larger than a length of the respective bumps of the first group of output bumps.

5. A liquid crystal display according to claim 1, wherein a following relationship is established when the area of respective bumps of the second group of output bumps is set as Si and the area of respective bumps of the first group of output bumps is set as So 1.05So>>Si>>1.02So.

6. A liquid crystal display according to claim 1, wherein the area of respective bumps of the second group of output bumps is made larger than the area of respective bumps of the first group of output bumps by 2 to 5%.

7. A liquid crystal display according to claim 1, wherein the liquid crystal display defines respective regions surrounded by gate signal lines extended in the X direction and arranged in parallel in the Y direction and drain signal lines extended in the Y direction and arranged in parallel in the X direction as pixel regions on the liquid-crystal-side surface of the one substrate, the liquid crystal display further includes switching elements operated in response to scanning signals from one-side gate signal lines and pixel electrodes to which video signal are supplied from one-side drain signal lines through the switching elements on the pixel regions, and the signal lines include the gate signal lines and the semiconductor chip includes a scanning signal driving circuit.

8. A liquid crystal display according to claim 1, wherein the liquid crystal display defines respective regions surrounded by gate signal lines extended in the X direction and arranged in parallel in the Y direction and drain signal lines extended in the Y direction and arranged in parallel in the X direction as pixel regions on the liquid-crystal-side surface of one substrate, the liquid crystal display further includes switching elements operated in response to scanning signals from one-side gate signal lines and pixel electrodes to which video signal are supplied from the one-side drain signal lines through the switching elements on the pixel regions, and the signal lines includes the drain signal lines and the semiconductor chip includes a video signal driving circuit.

* * * * *